United States Patent [19]
Miwa

[11] Patent Number: 5,586,075
[45] Date of Patent: Dec. 17, 1996

[54] ELECTRICALLY ERASABLE AND PROGRAMMABLE READ-ONLY MEMORY HAVING REDUNDANT MEMORY CELL ROW

[75] Inventor: Tohru Miwa, Tokyo, Japan

[73] Assignee: NEC Corporation, Tokyo, Japan

[21] Appl. No.: 429,901

[22] Filed: Apr. 27, 1995

[30] Foreign Application Priority Data

Apr. 27, 1994 [JP] Japan ................................. 6-089278

[51] Int. Cl.$^6$ ........................................................ G11C 7/00
[52] U.S. Cl. ........................................ 365/185.29; 365/200
[58] Field of Search ......................... 365/185.29, 185.33, 365/195, 200, 218

[56] References Cited

U.S. PATENT DOCUMENTS 4,630,241  12/1986  Kobayashi ............................. 365/200

FOREIGN PATENT DOCUMENTS 4-159696  6/1992  Japan.

*Primary Examiner*—A. Zarabian
*Attorney, Agent, or Firm*—Sughrue, Mion, Zinn, Macpeak & Seas

[57] ABSTRACT

A non-volatile semiconductor memory having a redundant memory cell row and a row address selector. During one of read and write operations, the row address selector outputs a regular row address signal from a row address signal buffer as the selected row signal. During an erase operation, the row address selector outputs a defective row address signal from a defective row address memory as the selected row signal, and a row decoder unit provides an erase preventing voltage to one of unused word line and unused redundant word line according to the selected row address signal, a redundant row use flag signal, and a substitution signal to prevent the erasing of unused memory cells.

9 Claims, 5 Drawing Sheets

ELECTRICALLY ERASABLE AND PROGRAMMABLE READ-ONLY MEMORY HAVING REDUNDANT MEMORY CELL ROW

BACKGROUND OF THE INVENTION

1. Field of the Invention

The present invention relates to a nonvolatile semiconductor memory, and more specifically to a flash EEPROM (electrically erasable and programmable read-only memory) type nonvolatile semiconductor memory having redundant memory cell rows.

2. Description of Related Art

The flash EEPROM is one of nonvolatile semiconductor memories for which a writing and an erasing can be electrically repeated. This flash EEPROM is configured such that an erasing is limited only to a blanket erasing to a plurality of memory cells, and therefore, can be simplified in comparison with the conventional EEPROM and can be constructed to have a larger storage capacity than that of the conventional EEPROM.

The flash EEPROM is ordinarily constructed so that a memory cell composed of one floating gate transistor stores one bit of data. This memory cell stores the data by utilizing a change of the threshold depending upon the amount of electric charges accumulated in an electrically insulated floating gate. The reading of the data stored in the memory cell is performed by discriminating regardless of whether a current flows between a source and a drain of the floating gate transistor (which constitutes one memory cell, and which will be called a "memory cell transistor" hereinafter), when a predetermined voltage is applied to a control gate of the memory cell transistor.

Adjustment (writing and erasing) of the amount of electric charges accumulated in the floating gate is performed by using a voltage higher than a voltage used at the time of the data reading, so that the electric charge is caused to move between the floating gate and a substrate portion between the source and the drain.

Referring to FIG. 1, there is shown a block diagram of a typical conventional nonvolatile semiconductor memory of this type.

The shown conventional nonvolatile semiconductor memory comprises:

a cell array 1 including a plurality of memory cells MC arranged in the form of a matrix having a plurality of rows and a plurality of columns, and each of the memory cells MC being formed of a floating gate transistor, a plurality of word lines WL each arranged along a corresponding memory cell row and connected to gates of transistors included in the corresponding memory cell row, a plurality of digit lines DL each arranged along a corresponding memory cell column and connected to drains of transistors included in the corresponding memory cell columns, a plurality of source lines SL each arranged along a corresponding memory cell column and connected to sources of transistors included in the corresponding one memory cell columns, the plurality of source lines SL being connected to each other;

a column address buffer 4 and a row address buffer 5 receiving and holding a column address signal ADc and a row address signal ADr an external, respectively;

a row decoder 10x for bringing to a ground potential all the word lines WL of the cell array 1 at the time of an erasing operation where an erase signal EE is active, the row decoder operating, in an operation other than the erasing operation, namely, in a writing operation and in a reading operation, to select one of the plurality of word lines WL in accordance with the row address signal ADr from the row address buffer 5 and to apply to the selected word line a (control gate) voltage selected for a designated operation (ordinarily 12 V in the writing operation and 5 V in the reading operation, assuming that a supply voltage is 5 V);

a source voltage switching circuit 3 for supplying an erase voltage (ordinarily 12 V) to all the source lines SL at the time of the erasing operation, the source voltage switching circuit 3 operating to bring all the source lines SL to the ground potential in the operation other than the erasing operation;

a column selector 12 for selecting one of the plurality of digit lines DL in accordance with the column address signal ADc from the column address buffer 4;

a write/read circuit 13 for supplying to the selected digit line DL a write (drain) voltage (6~7 V) corresponding to an input data (Di) in the writing operation where a write signal WE is active, the write/read circuit 13 operating, in the reading operation, to detect and amplify a current flowing the selected digit line DL so as to output an amplified data signal (Do); and a voltage switch circuit 14x for generating voltages to be supplied to the digit lines DL and the word lines WL in the writing operation and in the reading operation, so as to supplying the generated voltages to the write/read circuit 13 and the row decoder 10x.

In the above mentioned example, all the source lines SL are connected in common, so that the whole of the cell array 1 is erased simultaneously. However, the cell array 1 has a very large storage capacity, the cell array is divided into a plurality of erasing units or blocks each including the memory cells on the order of a few ten thousands bits to a few hundred thousands bits, so that the erasing is performed in units of one block.

To read data stored in the memory cell MS, the source line SL is grounded, a supply voltage is applied to a selected word line and the ground potential is applied to the other non-selected word lines by action of the row decoder 10. In addition, one digit line DL is selected by the column selector 12 so that the current flowing through the selected digit line DL is detected by the write/read circuit 13. In general, when the current is detected, the value "1" is allocated, and when the current is not detected, the value "0" is allocated.

To write data to the memory cell, about 12 V is applied to a selected word line WL (the control gate of the memory cell transistor) by the row decoder 10, and about 7 V is applied from the write/read circuit 13 to a digit line DL (the drain of the memory cell transistor) selected by the column selector 12, so that hot electrons are injected to the floating gate of the selected memory cell transistor. As a result, the threshold of the written memory cell transistor becomes higher than the gate voltage for the reading operation, for example, on the order of 7 V.

The erasing is performed by grounding all the word lines WL and applying a high voltage (on the order of 12 V) to the source lines SL, so that the electrons are extracted from the floating gate of all the memory cell transistors in the cell array 1, by action of the Fowler-Nordheim effect. As a result, the threshold of all the memory cell transistors simultaneously becomes lower than the gate voltage for the reading operation.

In general, since individual memory cells of the flash EEPROM are subjected to small variation in a manufacturing process, the memory cells inevitably have variations in the threshold after the blanket erasure. Since the upper limit of a threshold distribution of the erased memory cells is required to be read out as the value "1", it is necessary to make the gate voltage applied at the time of the reading, as low as possible. On the other hand, a lower limit of the threshold distribution of the erased memory cells have to be not less than 0 V. If there is a memory cell transistor having the after-erase threshold of less than 0 V, the memory cell transistor will allow a current to flow between the source and the drain thereof even if the associated word line is not selected (namely, the associated word line is at the ground potential), with the result that the value "1" is erroneously read out although all the other memory cells connected to the digit line connected to the memory cell transistor in question have a proper threshold. In the writing operation, a leakage current flows through the memory cell transistor in question between the digit line and the ground, with the result that a satisfactory writing characteristics cannot be obtained. In the following, a failure in which the threshold of the memory cell transistor is lower than the ground potential, will be called a "low threshold defect" of the memory cell. In order to minimize the variation of the after-erase threshold of the memory cell transistors so as to avoid generation of the "low threshold defect" of the memory cell, it is necessary to write "0" to all the memory cells before the blanket erase of the flash EEPROM so that the threshold of all the memory cells is brought to about 7 V. This is called a "pre-erase writing".

In semiconductor memories such as RAM having a very large scale array, on the other hand, a defective repairing manner is known to previously prepare a row of redundant memory cells and to replace a memory cell row including a defective ordinarily (namely non-redundant) memory cell, by the row of redundant memory cells. This is very effective in repairing a defective in the memory cell array, in particular, a failure occurring in connection with the word lines, and therefore, in elevating the production yield. In this defective repairing manner, the row of redundant memory cells is formed together with rows of non-redundant memory cells in the same array, so that the digit lines are used in common to the row of redundant memory cells and the rows of non-redundant memory cells, in order to suppress increase of the circuit.

The flash EEPROM is increasing its memory capacity toward a large storage capacity. With microminiaturization of memory cell transistors and enlargement of the cell array area, defective memory cells have appeared, and influence of appearance of the defective memory cells to a cost has become non-negligible. Particularly, in order to repair the defective such as a short-circuiting between adjacent word lines so as to elevate the production yield, it is indispensable to adopt redundant memory cell rows in a word line direction.

Referring to FIG. 2, there is shown an example of the flash EEPROM including redundant memory cell rows in a word line direction. In FIG. 2, elements similar to those shown in FIG. 1 are given the same Reference Numerals, and explanation thereof will be omitted.

The nonvolatile semiconductor memory shown in FIG. 2 is different from the nonvolatile semiconductor memory shown in FIG. 1 in the following points: The nonvolatile semiconductor memory shown in FIG. 2 additionally comprises:

a redundant cell array 2 including a redundant memory cell row composed of a plurality of redundant memory cells RMC, each of which is formed a transistor having the same structure as that of the memory cell transistor MC, and which are arranged in all the columns of the cell array 1, a drain and a source of each redundant memory cell RMC being respectively connected to the digit line DL and the source line SL of a corresponding memory cell column, and a redundant word line RWL arranged along the redundant memory cell row and connected to a control gate of the redundant memory cells RMC included in the redundant memory cell row;

a redundant row use flag 6 and a defective row address memory 7, both of a nonvolatile type, respectively for storing data indicative of use of the redundant memory cell row and an address of a row including a defective memory cell, when the defective memory cell is included in the cell array and the redundant memory cell row is to be used in place of the row including a defective memory cell;

a row address comparator 8 for generating an active substitution signal CX when the data stored in the redundant row use flag 6 is indicative of use of the redundant memory cell row and when an address designated by the row address signal ADr is consistent with the address stored in the defective row address memory 7; and a redundant row decoder 11x operating, in a writing operation or in a reading operation, to supplying to the redundant word line RWL a voltage selected for a designated operation, if the substitution signal CX is active and if the data stored in the redundant row use flag 6 is indicative of use of the redundant memory cell row, the redundant row decoder 11xoperating also operating to supply the ground potential to the redundant word line RWL in the other operation.

Furthermore, a row decoder 10y, corresponding to the row decoder 10x shown in FIG. 1, operates to ceaselessly maintain at a non-selected level the word line designated by the address stored in the defective row address memory 7 when the data stored in the redundant row use flag 6 is indicative of use of the redundant memory cell row.

In the above mentioned nonvolatile semiconductor memory, since the blanket erase is performed by applying a high voltage to the source lines SL connected to all the memory cells included in an erase unit, the defective memory cell row in the cell array 1 which had been replaced by the redundant memory cell row, and a memory cell row that are never used such as a redundant memory cell row which had not been substituted for the defective memory cell row, are ceaselessly in a non-selected condition, and therefore, are repeatedly subjected to only the erasing operation, without being subjected to even the "pre-erase writing", with the result that the threshold becomes less than 0 V. However, since the drain of these memory cell transistors that are never used is connected to the digit line connected to the memory cell transistors that are used, the reading error and the defective writing as mentioned hereinbefore will occur because of the memory cell causing the "low threshold defect".

In order to avoid the "low threshold defect" of the memory cell, it might be considered to perform the "pre-erase writing", similarly to the memory cell transistors that are used. However, since most of the defective memory cell row which had been replaced by the redundant memory cell row, is a failure in which the memory cell cannot be written, or another failure in which the written condition will disappear abnormally quickly, it is not possible to avoid the "low threshold defect" of the memory cell. As another means for avoiding the "low threshold defect" of the memory cell, it might be considered to divide the source lines of the memory cell transistors in units of row, so that at the time of the blanket erase, a high voltage is never applied to the source of the memory cell transistors that are never used, for the purpose of preventing the lowering of the threshold. However, the division of the source lines will inevitably result in an increased cell array area, and therefore, in an increased cost. Accordingly, this is not practical.

SUMMARY OF THE INVENTION

Accordingly, it is an object of the present invention to provide a nonvolatile semiconductor memory which has overcome the above mentioned defect of the conventional ones.

Another object of the present invention is to provide a flash EEPROM type nonvolatile semiconductor memory capable of preventing the "low threshold defect" of the memory cell and avoiding an increase of a chip area.

The above and other objects of the present invention are achieved in accordance with the present invention by a flash EEPROM memory having a redundant memory cell row, the improvement comprising a row address selector for selecting an address stored in defective row address memory in an erasing operation and a row address signal in an operation other than the erasing operation, so that in the erasing operation, on the basis of an address signal outputted from a row address selector, a content of a redundant row use flag and a substitution signal, a row decoder and a redundant row decoder supply an erase preventing voltage to a word line or a redundant word line that is not used, whereby the erasing operation is not performed for memory cells included in the memory cell row or redundant memory cell row that is not used.

In the nonvolatile semiconductor memory in accordance with the present invention, at the time of the erasing, the erase preventing voltage is applied to the word line connected to the memory cell row that is never used such as a defective memory cell row which had been replaced by a redundant memory cell row, and a redundant memory cell row which had not been substituted for the defective memory cell row. As a result, the erasing operation is never performed for memory cells included in the memory cell row that is never used. Accordingly, these memory cells are never brought into an over-erased condition, and therefore, generation of the "low threshold defect" of the memory cell can be prevented. In addition, since the non-redundant cell array and the redundant cell array are similar to those of the conventional example, the cell array area is not increased. On the other hand, since the circuit newly added to the conventional memory is a small amount, the increase of the chip area can be effectively prevented.

The above and other objects, features and advantages of the present invention will be apparent from the following description of preferred embodiments of the invention with reference to the accompanying drawings.

DESCRIPTION OF THE PREFERRED EMBODIMENTS

Figure 1:
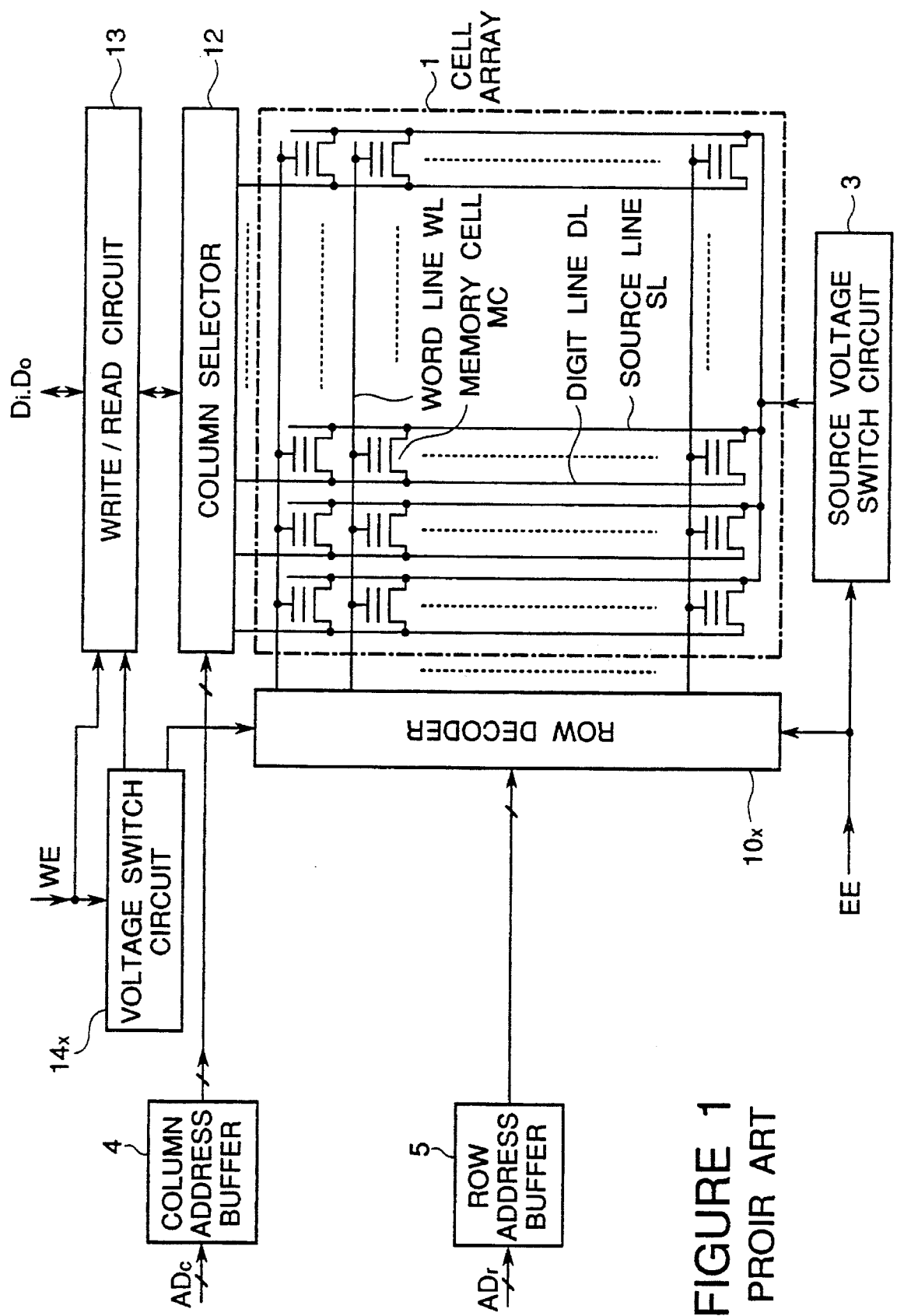
FIG. 1 is a block diagram of a first example of the conventional nonvolatile semiconductor memory.
Figure 2:
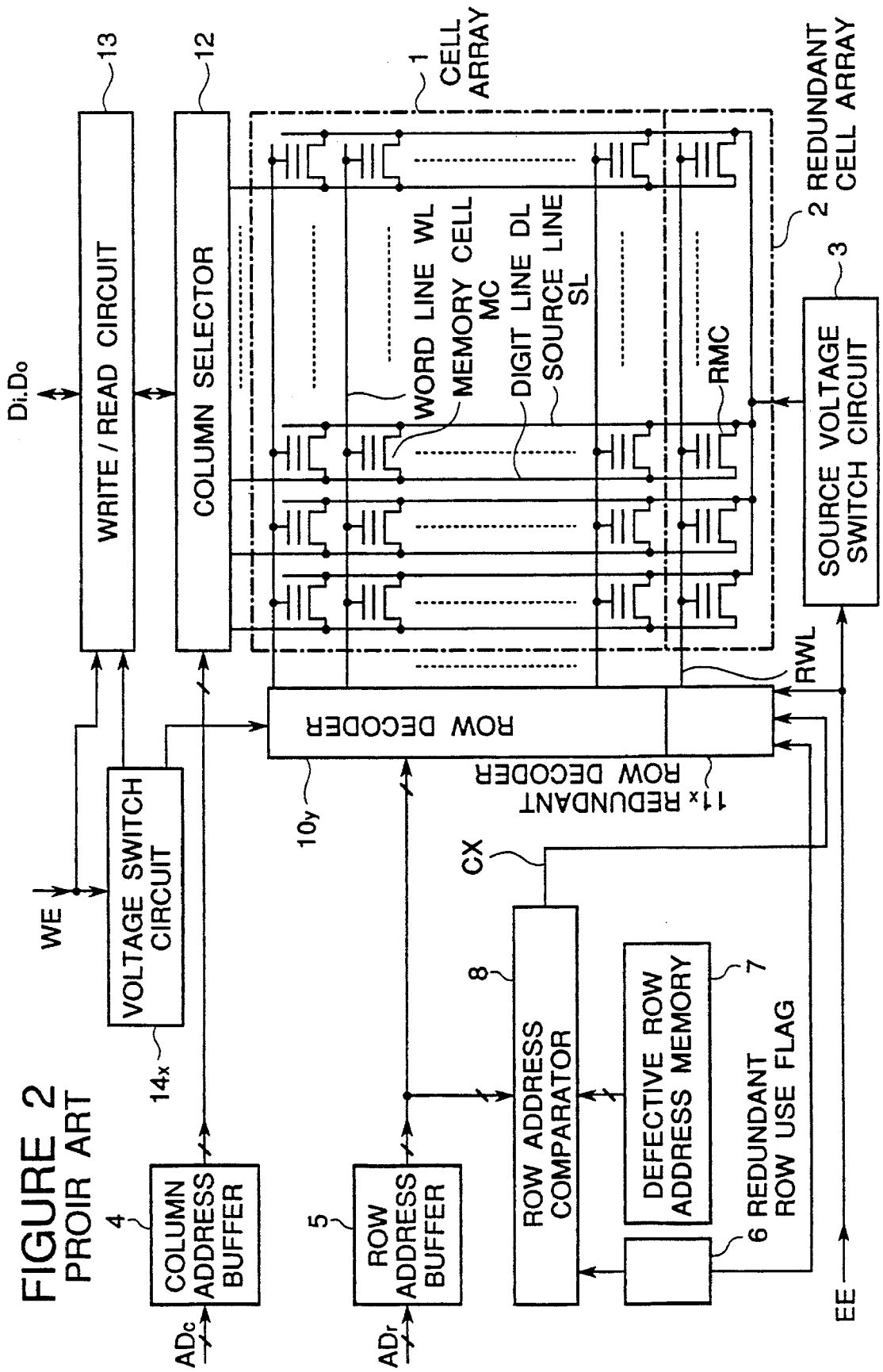
FIG. 2 is a block diagram of a second example of the conventional nonvolatile semiconductor memory.
Figure 3:
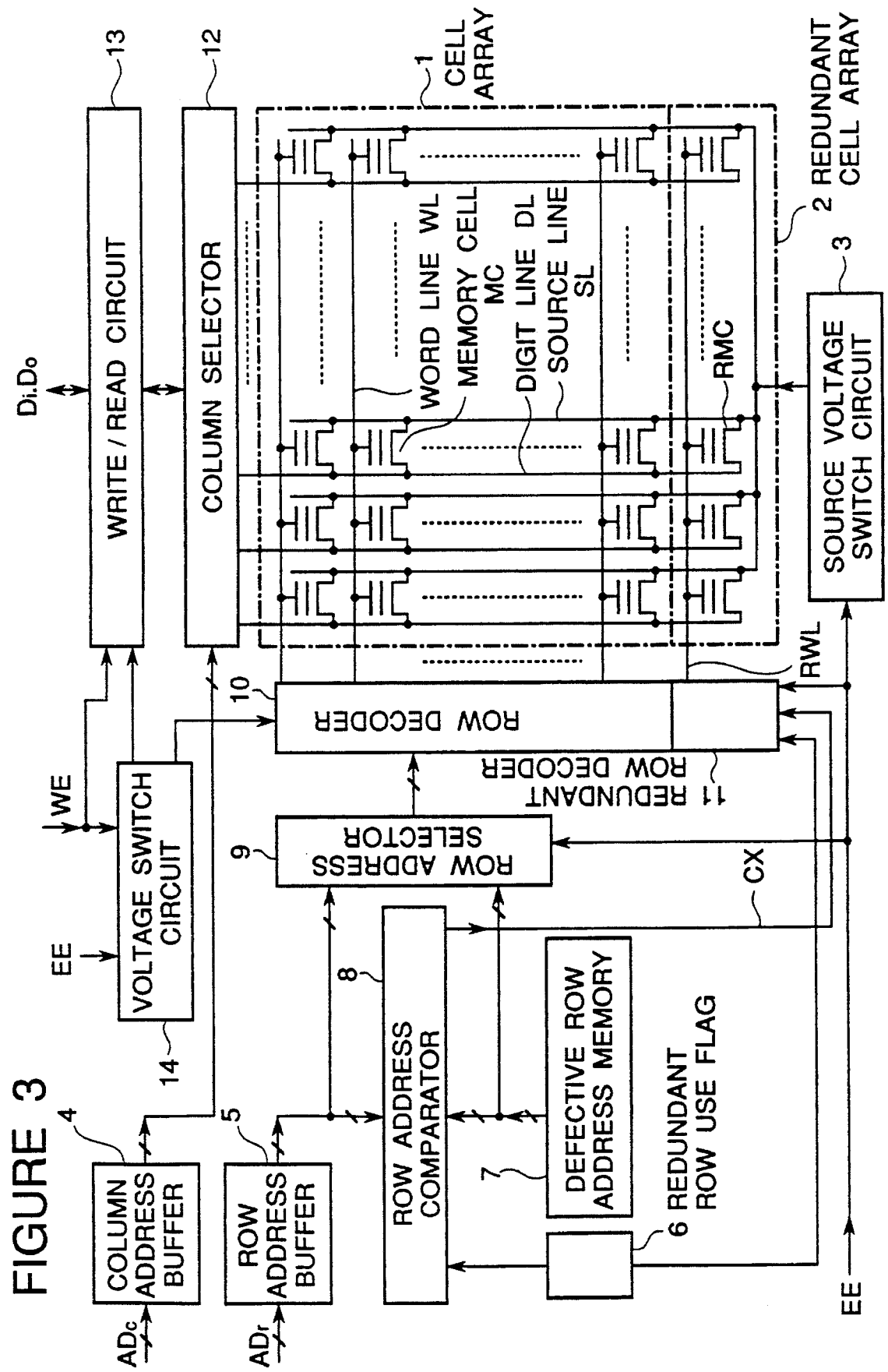
FIG. 3 is a block diagram of a first embodiment of the nonvolatile semiconductor memory in accordance with the present invention.

Referring to FIG. 3, there is shown a block diagram of a first embodiment of the nonvolatile semiconductor memory in accordance with the present invention. In FIG. 3, elements similar to those shown in FIG. 2 are given the same Reference Numerals, and explanation thereof will be omitted for simplification of the description.

As will be seen from comparing FIGS. 2 and 3, the first embodiment shown in FIG. 3 of the nonvolatile semiconductor memory in accordance with the present invention is different from the conventional nonvolatile semiconductor memory shown in FIG. 2 in the following points:

The nonvolatile semiconductor memory shown in FIG. 3 in accordance with the present invention additionally includes a row address selection circuit 9 receiving the output of the row address buffer 5 and the output of the defective row address memory 7 and controlled by the erase signal EE to select and output the address stored in the defective row address memory 7 in the erase operation. In an operation other than the erase operation, the row address selection circuit 9 selects and output the row address signal ADr supplied from the row address buffer 5.

In addition, a row decoder 10 and a redundant row decoder 11, corresponding to the row decoder 10y and the redundant row decoder 11x in FIG. 2, are configured to be controlled by the output of the redundant row use flag 6, the output of the row address comparator 8 and the erase signal EE in such a manner that, in the erasing operation, if the data stored in the redundant row use flag 6 is indicative of use of the redundant memory cell row, the row decoder 10 supplies an erase preventing voltage of a predetermined level to the word line WL selected from the non-redundant cell array 1 in accordance with the address signal outputted from the row address selector 9, and if the data stored in the redundant row use flag 6 does not indicate use of the redundant memory cell row, the redundant row decoder 11 supplies the erase preventing voltage of the predetermined level to the redundant word line RWL corresponding to the redundant row use flag 6.

Furthermore, the row decoder 10 and the redundant row decoder 11 are configured to be controlled in such a manner that, in an operation other than the erasing operation, if the substitution signal CX is active, the redundant row decoder 11 supplies a voltage predetermined for a designated operation, to the redundant word line RWL corresponding to the redundant row use flag 6, and if the substitution signal CX is inactive, the row decoder 11 supplies the voltage predetermined for the designated operation, to the word line WL selected from the non-redundant cell array 1 in accordance with the address signal outputted from the row address selector 9.

Moreover, the voltage switching circuit 14 is configured to generate the above mentioned erase preventing (gate) voltage in the erasing operation, in addition to the writing (drain) voltage and the reading (drain) voltage in the operation other than the erasing operation, and the (control gate) voltage selected for the writing operation and the reading operation, which are supplied to the row decoder 10, the redundant row decoder 11 and the write/read circuit 13.

Assuming that the supply voltage is 5 V and the erasing voltage supplied to the source lines SL is 12 V, the erase preventing (gate) voltage is selected in the range of 5 V to 12 V, and therefore, the erasing (source) voltage of 12 V can be used without modification as the erase preventing (gate) voltage.

Now, operation of the first embodiment will be described.

The writing operation and the reading operation, other than the erasing operation, is the same as those of the conventional example shown in FIG. 3, excepting that the row address signal ADr held in the row address buffer 5 is selected by the row address selector 9 so as to be supplied to the row decoder. Therefore, explanation of the writing operation and the reading operation will be omitted.

In the erasing operation, when the redundant memory cell row is out in a use condition, the row decoder 10 selects the word line WL designated by the address stored in the defective row address memory 7, namely, the word line WL of the memory cell row in the cell array 1 which had been replaced by the redundant memory cell row and which therefore is no longer used, and the row decoder 10 supplies the erase preventing voltage to the selected word line WL.

When the redundant memory cell row is not used, the redundant row decoder 11 selects the redundant word line RWL for the redundant memory cell row that is never used, and supplies the erase preventing voltage to the redundant word line RWL.

Thus, the erasing operation is not performed for the non-redundant or redundant memory cell row that is not used, and therefore, the memory cells (MC or RMC) included in the non-redundant or redundant memory cell row that is not used, never become over-erased, so that the "low threshold defect" is effectively prevented.

On the other hand, the ground potential applied to the word lines WL and the redundant word line RWL of the non-redundant or redundant memory cell rows that are used, and the erasing (source) voltage is applied from the source voltage switching circuit 3 to the source lines SL connected in common. Accordingly, the erasing operation is performed for these non-redundant or redundant memory cell rows that are used. Ordinarily, since the "pre-erase writing" has been performed for these non-redundant or redundant memory cell rows that are used, after the erasing operation is performed, the non-redundant or redundant memory cell rows that are used, are put in an erased condition having the threshold coming within a predetermined voltage range.

In this first embodiment, since the cell array 1 and the redundant cell array 2 are the same as those of the conventional example shown in FIG. 2, the area of the cell array is not increased. The circuit added in accordance with the present invention is small in comparison with the other existing circuits, the increase in the chip area caused by the additional circuit is extremely small.

Figure 4:
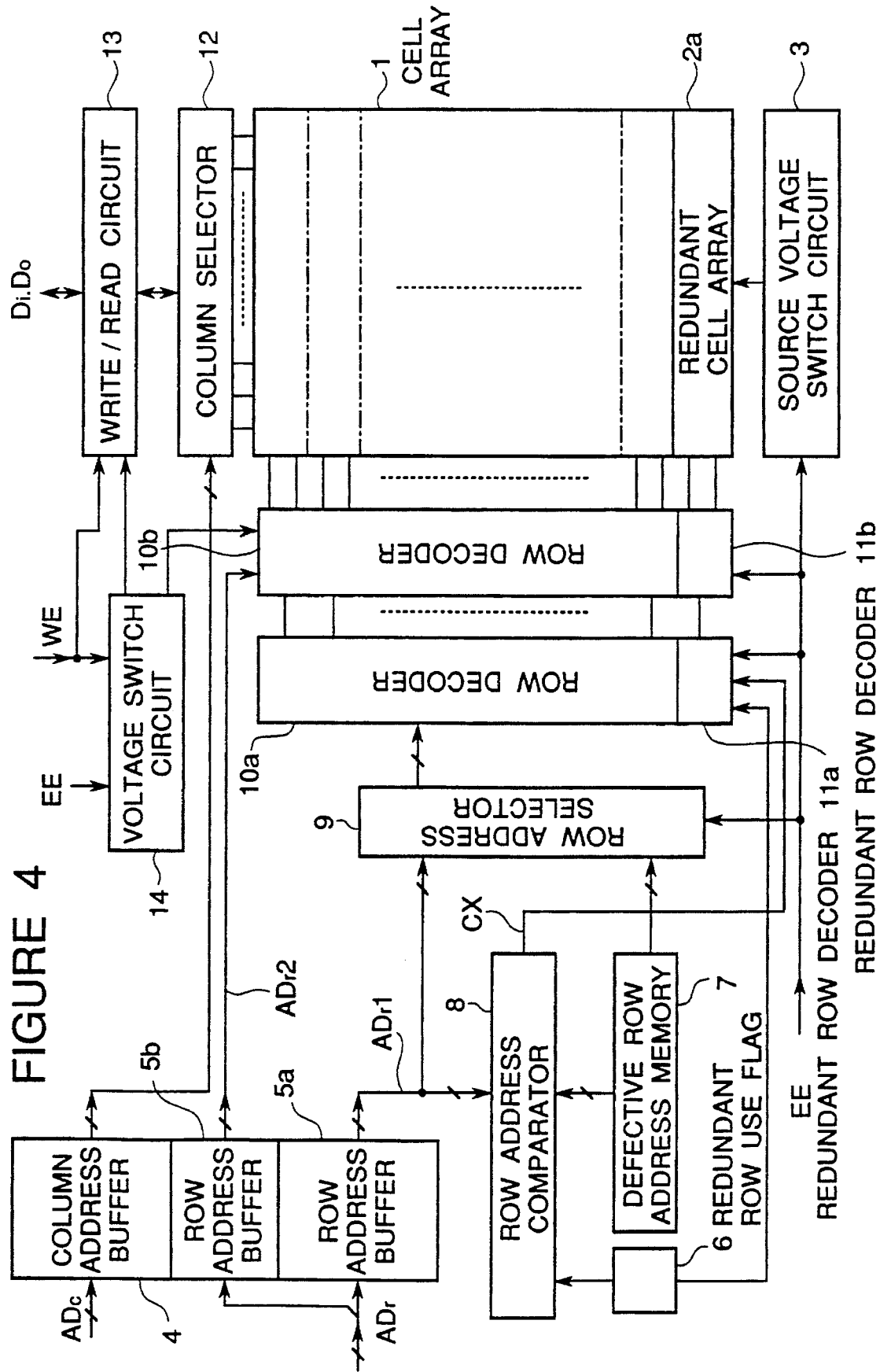
FIG. 4 is a block diagram of a second embodiment of the nonvolatile semiconductor memory in accordance with the present invention.

Referring to FIG. 4, there is shown a block diagram of a second embodiment of the nonvolatile semiconductor memory in accordance with the present invention. In FIG. 4, elements similar to those shown in FIG. 3 are given the same Reference Numerals, and explanation thereof will be omitted for simplification of the description.

As will be seen from comparison between FIGS. 3 and 4, the second embodiment shown in FIG. 4 is different from the first embodiment shown in FIG. 3 in the following points:

The second embodiment shown in FIG. 4 is configured so that the row address signal ADr is divided into a first row address signal ADr1 and a second row address signal ADr2, which are received and held in a row address decoders 5a and 5b, respectively. The defective row address memory 7 stores an address portion corresponding to the first row address signal ADr1, and the row address comparator 8 compares the first row address signal ADr1 with the address stored in the defective row address memory 7. The row address selector 9 is connected to receive the first row address signal ADr1 and the address stored in the defective row address memory 7 so as to select either the first row address signal ADr1 or the address stored in the defective row address memory 7.

In addition, the row decoder and the redundant row decoder are respectively divided into first and second row decoders 10a and 10b and first and second redundant row decoders 11a and 11b, which correspond to the first and second row address signals ADr1 and ADr2, respectively. A redundant cell array 2a includes a plurality (for example, even number such as 2, 4, or . . .) of redundant memory cell rows and the same number of redundant word lines.

The first row decoder 10a and the first redundant row decoder 11a are controlled by the address signal outputted from the row address selector 9, the data stored in the redundant row use flag 6 and the substitution signal CX, so as to select a plurality (for example, even number such as 2, 4, or . . .) of word lines in the cell array 1 or a plurality (for example, even number such as 2, 4, or . . .) of redundant word lines in the redundant cell array 2a. More specifically, in the operation other than the erasing operation, the second row decoder 10b and the second redundant row decoder 11b select, in accordance with the second row address signal ADr2, one of the plurality of non-redundant or redundant word lines selected by the first row decoder 10a and the first redundant row decoder 11a. In the erasing operation, the second row decoder 10b and the second redundant row decoder 11b are controlled by the erase signal EE to select, without modification, the plurality of non-redundant or redundant word lines selected by the first row decoder 10a and the first redundant row decoder 11a.

Thus, the defective memory cell rows are replaced by the redundant memory cell rows, in units of a plurality of rows, and in the erasing operation, the erase preventing (control gate) voltage is applied in units of the same plurality of rows.

This second embodiment is advantageous in the case that it is expected that defective memory cells exits in a plurality of adjacent memory cell rows. A basic operation and an advantage of the second embodiment are the same as those of the first embodiment, and therefore, further explanation will be omitted.

Figure 5:
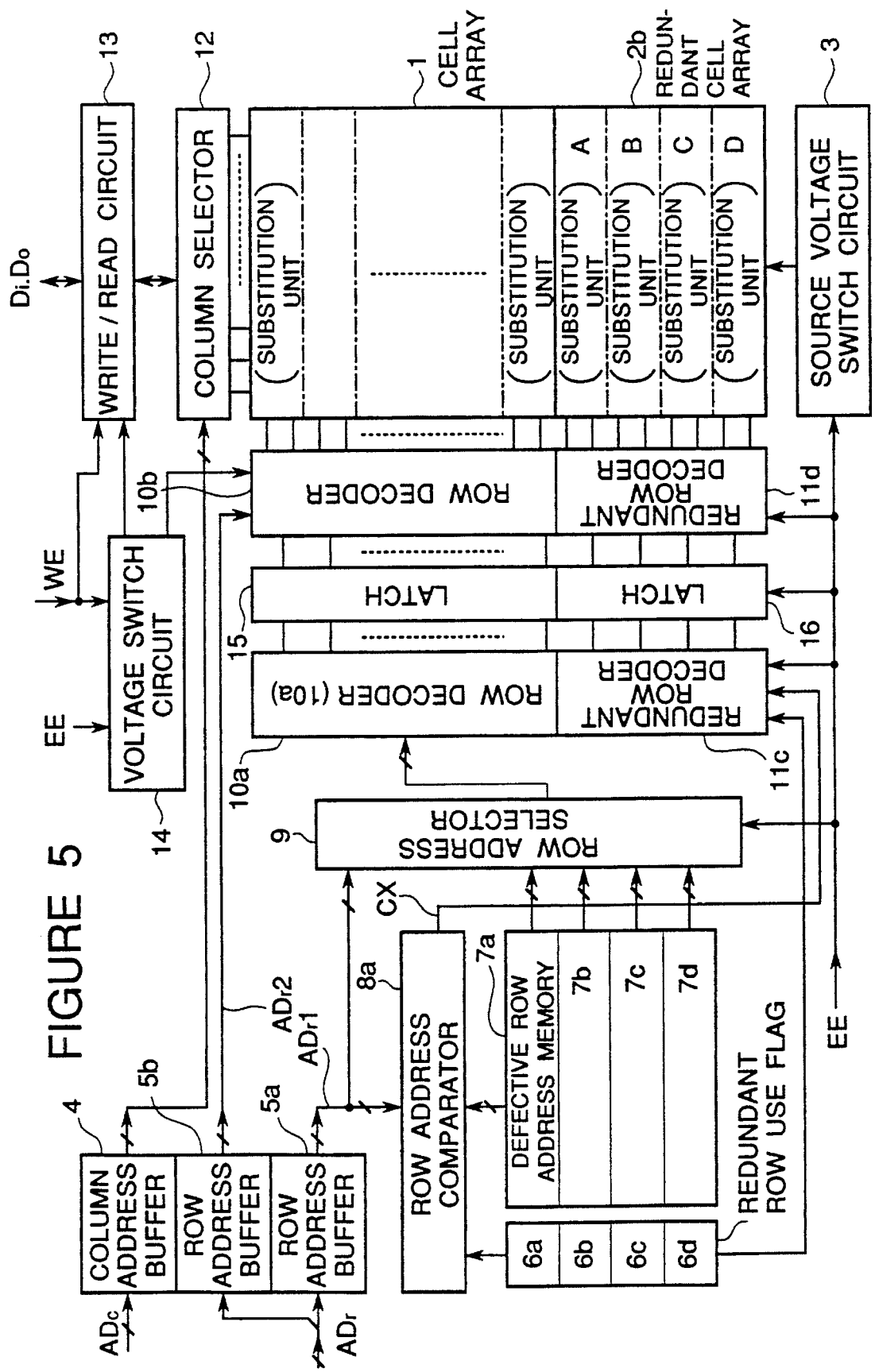
FIG. 5 is a block diagram of a third embodiment of the nonvolatile semiconductor memory in accordance with the present invention.

Referring to FIG. 5, there is shown a block diagram of a third embodiment of the nonvolatile semiconductor memory in accordance with the present invention. In FIG. 5, elements similar to those shown in FIG. 4 are given the same Reference Numerals, and explanation thereof will be omitted for simplification of the description.

As will be seen from comparison between FIGS. 4 and 5, the third embodiment shown in FIG. 5 is different from second embodiment shown in FIG. 4 in the following points:

The third embodiment shown in FIG. 5 includes a redundant cell array 2b composed of a plurality of substitution units labelled "A", "B", "C" and "D", each of which includes a plurality of redundant memory cell rows and a corresponding number of associated redundant word lines. There are provided a plurality of redundant row use flags 6a, 6b, 6c and 6d of the number corresponding to the number of the substitution units in the redundant cell array 2b, and the same number of defective row address memories 7a, 7b, 7c and 7d.

A row address selector 9 receives the first row address signal ADr1 supplied form the first row address buffer 5a and the addresses supplied from the defective row address memories 7a, 7b, 7c and 7d. In the erasing operation, the row address selector 9 sequentially supplies the he addresses supplied from the defective row address memories 7a, 7b, 7c and 7d, which correspond to one or ones of the redundant row use flags 6a, 6b, 6c and 6d storing data indicative of use of a corresponding redundant memory cell substitution unit.

A first and second redundant row decoders 11c and 11d are configured to correspond to the substitution units, and a first latch circuit 15 is inserted between the first and second row decoders 10a and 10b, and a second latch circuit 16 is inserted between the first and second redundant row decoders 11c and 11d. In the erasing operation, these latch circuits 15 and 16 latch the output signals of the first row decoder 10a and the first redundant row decoder 11c. In the operation other than the erasing operation, the latch circuits 15 and 16 pass the output signals of the first row decoder 10a and the first redundant row decoder 11c to the second row decoder 10b and the second redundant row decoder 11d.

Thus, the third embodiment is so configured that the substitution unit is composed of a plurality of rows, similarly to the second embodiment, and in addition, the redundant cell array 2a includes a plurality of substitution units. To comply with the plurality of substitution units included in the redundant cell array 2a, the redundant row use flag, the redundant row address memory, the row address selector and the first and second redundant decoders are different from those of the second embodiment, and the latch circuits 15 and 16 are newly added.

Now, operation of the third embodiment will be explained.

In the writing operation and the reading operation other than the erasing operation, firstly, the row address comparator 8a compares the first row address signal ADr1 with the addresses stored in all the defective row address memories 7a, 7b, 7c and 7d. If there is the stored address consistent with the first row address signal ADr1, and if the redundant row use flag (6a, 6b, 6c or 6d) corresponding to the defective row address memory (7a, 7b, 7c or 7d) holding the stored address consistent with the first row address signal ADr1, is indicative of use of the redundant memory cell row, the row address comparator 8a outputs the active substitution signal CX. In accordance with the active substitution signal CX and the output data of the redundant row use flag (6a, 6b, 6c or 6d) corresponding to the defective row address memory (7a, 7b, 7c or 7d) holding the stored address consistent with the first row address signal ADr1, the redundant row decoder 11c selects a corresponding substitution unit in the redundant cell array 2b, and the redundant row decoder 11d selects one redundant word line included in the selected substitution unit, so as to supply a voltage selected for the designated operation (writing operation or reading operation) to the selected redundant word line. At this time, all the word lines included in the non-redundant cell array 1 are brought to the non-selected voltage (ground potential).

If none of the addresses stored in the defective row address memories is consistent with the first row address signal ADr1, the row address selector 9 selects the first row address signal ADr1, and the first row decoder 10a selects a corresponding substitution unit included in the cell array 1 in accordance with the first row address signal ADr1. Furthermore, in accordance with the second row address signal ADr2, the second row address decoder 10b selects one word line included in the selected substitution unit so as to apply the selected voltage to the selected word line. At this time, all the word lines included in the redundant cell array 2b are brought to the non-selected voltage (ground potential).

In the erasing operation, the address or addresses stored in the defective row address memory or memories (7a, 7b, 7c or 7d) corresponding to the redundant row use flag or flags (6a, 6b, 6c or 6d) indicative of use of the redundant memory cell row, are sequentially outputted from the row address selector 9. On the basis of the output signal of the redundant row use flags 6a, 6b, 6c and 6d and the row address signal outputted from the row address selector 9, the row decoder 10a selects the substitution unit included in the cell array 1 at an address designated by the row address signal outputted from the row address selector 9, corresponding to the redundant row use flag indicative of use of the redundant memory cell row. The redundant row decoder 11c selects the substitution unit included in the redundant cell array 2b corresponding to the redundant row use flag which does not indicate use of the redundant memory cell row.

The outputs of the first row decoder 10a and the first redundant row decoder 11c are held in the latch circuits 15 and 16 during a period of the erasing operation, and supplied to the second row decoder 10b and the second redundant row decoder 11d, which supply the erase preventing voltage to a plurality of non-redundant and redundant word lines included in the substitution units selected in accordance with the signals supplied from the latch circuits 15 and 16.

In this third embodiment, it is possible to obtain the same advantage as that obtained in the first and second embodiments, and in addition, since the redundant cell array 2b includes a plurality of substitution units, the repairing efficiency can be elevated even if defective memory cells disperse.

Furthermore, the third embodiment can be modified so that the row address signal ADr is not divided, and the substitution unit is composed of only one memory cell row or one redundant memory cell row.

The invention has thus been shown and described with reference to the specific embodiments. However, it should be noted that the present invention is in no way limited to the details of the illustrated structures but changes and modifications may be made within the scope of the appended claims.

I claim:

1. An electrically erasable and programmable read-only memory having a redundant memory cell row comprising:

a row address selector for selecting a defective row address signal from a defective row address memory during an erasing operation, and for selecting a row address signal from a row address signal buffer during read and write operations, wherein during the erasing operation, on the basis of a selected address signal outputted from said row address selector, a content of a redundant row use flag, and a substitution signal, one of row decoder and redundant row decoder provides an erase preventing voltage to one of unused word line associated with a defective row and redundant word line associated with a row of redundant cells depending on whether defective row exists, thereby preventing the erasing of unused memory cells in one of the defective row and the row of redundant cells.

2. An electrically erasable and programmable read-only memory comprising:

a memory cell array having a plurality of first transistors, drains of said first transistors being interconnected to form a plurality of digit lines, sources of said first transistors being interconnected to form at least one source line, and gates of said first transistors being interconnected to form a plurality of word lines;

a redundant memory cell row having a plurality of second transistors, drains of said second transistors being interconnected and connected to the drains of said first transistors, sources of said second transistors being interconnected and connected to the sources of said first transistors, gates of said second transistors being interconnected to form a redundant word line;

address buffer means for storing a regular row address signal;

defective row address memory means for storing a defective row address signal;

row address comparing means for comparing said regular row address and said defective row address signals, and generating a substitution signal according to a comparative result;

row address selecting means for receiving an erase signal, said regular row address, and said defective row address signals, and outputting a selected row address signal during one of read, write and erase operations; and a row decoder unit for receiving said selected row address signal, said substitution signal, said erase signal, and a redundant row use flag signal, and outputting an erase preventing voltage of a predetermined level to one of said word and redundant word lines during said erase operation.

3. An electrically erasable and programmable read-only memory comprising:

first electrically erasable and programmable read-only memory cell array having a plurality of first transistors, drains of said first transistors being interconnected to form a plurality of digit lines, sources of said first transistors being interconnected to form at least one source line, and gates of said first transistors being interconnected to form a plurality of word lines;

second electrically erasable and programmable read-only memory cell array having a plurality of second transistors, drains of said second transistors being interconnected and connected to the drains of said first transistors, sources of said second transistors being interconnected and connected to the sources of said first transistors, gates of said second transistors being interconnected to form a plurality of redundant word lines;

first and second address buffer means for receiving a regular row address signal;

defective row address memory means for storing a defective row address signal;

row address comparing means for comparing said regular row address and said defective row address signal, and generating a substitution signal according to a comparative result;

row address selecting means for receiving an erase signal, a regular row address signal and a defective row address signal, and outputting a selected row address signal during one of read, write and erase operations; and first and second row decoder units, wherein said first row decoder unit receives said selected row address signal, said substitution signal, said erase signal, and a redundant row use flag signal, and said second row decoder unit receives said erase signal, and wherein said first and second row decoder units output an erase preventing voltage of a predetermined level to one of said word and redundant word lines during said erase operation.

4. The electrically erasable and programmable read-only memory of claim 1, wherein said electrically erasable and programmable read-only memory is a flash electrically erasable and programmable read-only memory.

5. The electrically erasable and programmable read-only memory of claim 2, wherein said electrically erasable and programmable read-only memory is a flash electrically erasable and programmable read-only memory.

6. The electrically erasable and programmable read-only memory of claim 3, wherein said electrically erasable and programmable read-only memory is a flash electrically erasable and programmable read-only memory.

7. The electrically erasable and programmable read-only memory of claim 3, further comprising a pair of latches coupled between said first and second row decoder units.

8. The electrically erasable and programmable read-only memory of claim 3, wherein said defective row address memory means comprises a plurality of defective row address memory.

9. The electrically erasable and programmable read-only memory of claim 3, wherein said second electrically erasable and programmable read-only memory cell array comprises a plurality of substitution units.

* * * * *